US011910720B2

United States Patent
Osawa et al.

(10) Patent No.: US 11,910,720 B2
(45) Date of Patent: Feb. 20, 2024

(54) PIEZOELECTRIC DEVICE AND MEMS DEVICE

(71) Applicant: SEIKO EPSON CORPORATION, Tokyo (JP)

(72) Inventors: Eiji Osawa, Matsumoto (JP); Hikaru Iwai, Matsukawa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 290 days.

(21) Appl. No.: 17/135,257

(22) Filed: Dec. 28, 2020

(65) Prior Publication Data
US 2021/0202823 A1 Jul. 1, 2021

(30) Foreign Application Priority Data

Dec. 26, 2019 (JP) ................. 2019-235876

(51) Int. Cl.
| | |
|---|---|
| *H01L 41/04* | (2006.01) |
| *H01L 41/053* | (2006.01) |
| *H10N 30/87* | (2023.01) |
| *B41J 2/14* | (2006.01) |
| *H10N 30/02* | (2023.01) |

(Continued)

(52) U.S. Cl.
CPC ........ *H10N 30/875* (2023.02); *B41J 2/14201* (2013.01); *H10N 30/02* (2023.02);
(Continued)

(58) Field of Classification Search
CPC ............... H10N 30/875; H10N 30/802; H10N 30/2047; H10N 30/88; H01L 41/0475;
(Continued)

(56) References Cited

U.S. PATENT DOCUMENTS

| | | |
|---|---|---|
| 6,472,610 B1 | 10/2002 | Kawabata |
| 2006/0043843 A1 | 3/2006 | Sugiura et al. |

(Continued)

FOREIGN PATENT DOCUMENTS

| | | |
|---|---|---|
| JP | H114027 A | 1/1999 |
| JP | 2002299994 A | 10/2002 |

(Continued)

OTHER PUBLICATIONS

Office Action for JP Patent Application No. JP2019235876, dated Sep. 26, 2023, 14 pages of Office Action.

*Primary Examiner* — Derek J Rosenau
(74) *Attorney, Agent, or Firm* — CHIP LAW GROUP

(57) ABSTRACT

Provided is a piezoelectric device and an MEMS device whose size can be reduced. The piezoelectric device includes: a first substrate that includes a first surface on which a piezoelectric element and a first electrode coupled to the piezoelectric element are disposed; a second substrate that includes a second surface on which a second electrode configured to be coupled to a control circuit is disposed; and a third substrate that is disposed between the first substrate and the second substrate, and includes a third surface bonded to the first surface and a fourth surface facing the second surface, in which the third substrate has a through hole passing through from the third surface to the fourth surface, and a third electrode provided in the through hole and coupled to the first electrode, and the second electrode is coupled to the third electrode and is electrically coupled to the first electrode via the third electrode.

13 Claims, 11 Drawing Sheets

(51) Int. Cl.
*H10N 30/88* (2023.01)
*H10N 30/80* (2023.01)
*H10N 30/20* (2023.01)

(52) U.S. Cl.
CPC ....... *H10N 30/2047* (2023.02); *H10N 30/802* (2023.02); *H10N 30/88* (2023.02)

(58) Field of Classification Search
CPC . H01L 41/042; H01L 41/0973; H01L 41/053; B06B 1/06; B06B 1/0607; B06B 1/0622
See application file for complete search history.

(56) References Cited

U.S. PATENT DOCUMENTS

| | | |
|---|---|---|
| 2007/0157731 A1 | 7/2007 | Okuda et al. |
| 2011/0316387 A1* | 12/2011 | Togasaki ................ H10N 30/01 310/334 |
| 2016/0263890 A1 | 9/2016 | Hamaguchi et al. |
| 2017/0018471 A1 | 1/2017 | Aono et al. |
| 2017/0028440 A1* | 2/2017 | Kiyose ................ H10N 30/073 |
| 2017/0225464 A1* | 8/2017 | Hirai ....................... B41J 2/161 |
| 2018/0093882 A1 | 4/2018 | Yoshiike |
| 2019/0100009 A1 | 4/2019 | Hirai |

FOREIGN PATENT DOCUMENTS

| | | |
|---|---|---|
| JP | 2004260239 A | 9/2004 |
| JP | 2006094459 A | 4/2006 |
| JP | 2007189303 A | 7/2007 |
| JP | 2017026387 A | 2/2017 |
| JP | 2018047637 A | 3/2018 |
| JP | 20180520233 A | 4/2018 |
| JP | 2019067932 A | 4/2019 |

* cited by examiner

PIEZOELECTRIC DEVICE AND MEMS DEVICE

The present application is based on, and claims priority from JP Application Serial Number 2019-235876, filed Dec. 26, 2019, the disclosure of which is hereby incorporated by reference herein in its entirety.

BACKGROUND

1. Technical Field

The present disclosure relates to a piezoelectric device and an MEMS device.

2. Related Art

In the related art, there has been known an electronic machine in which an MEMS device including an MEMS element is incorporated.

For example, an electronic machine described in JP-A-2018-47637 is a printer, and includes a recording head that discharges ink to form an image on a recording medium.

The recording head is provided with an actuator unit facing a pressure chamber to which ink is supplied, a pressure in the pressure chamber is changed by the actuator unit, and the ink is discharged from a nozzle provided in the pressure chamber.

The actuator unit is a piezoelectric device that is provided with a piezoelectric element as an MEMS element, and includes a vibration plate that is provided facing the pressure chamber, a piezoelectric element that is provided on the vibration plate, a drive IC that controls the piezoelectric element, and a sealing plate that is disposed between the vibration plate and the drive IC.

The sealing plate has a through hole passing through a surface facing the vibration plate and a surface facing the drive IC, and a through wiring is provided in the through hole. A conductive film electrically coupled to the through wiring is provided on a surface of the sealing plate that faces the vibration plate, and the conductive film is electrically coupled to an individual terminal provided on the vibration plate via a bump electrode. On the other hand, a surface facing the driving IC of the sealing plate is provided with an upper surface side wiring that is electrically coupled to the through wiring, and the upper surface side wiring is coupled to an IC terminal of the drive IC. The sealing plate is provided with a photosensitive bonding agent on an outer peripheral part of the surface facing the vibration plate, and is adhesively bonded to the vibration plate by the photosensitive bonding agent.

However, in the piezoelectric device described in JP-A-2018-47637, there is a problem that a position where the through wiring of the sealing plate and the bump electrode are provided and a position where the photosensitive bonding agent is provided need to be different in the plane direction, which hinders miniaturization of the piezoelectric device.

Although JP-A-2018-47637 is an example of the piezoelectric device using the piezoelectric element as the MEMS element, there is a similar problem when a functional element other than the piezoelectric element is used as the MEMS element.

SUMMARY

A piezoelectric device according to a first aspect includes a first substrate that includes: a first surface on which a piezoelectric element and a first electrode coupled to the piezoelectric element are disposed; a second substrate that includes a second surface on which a second electrode configured to be coupled to a control circuit is disposed; and a third substrate that is disposed between the first substrate and the second substrate, and includes a third surface bonded to the first surface and a fourth surface facing the second surface, in which the third substrate has a through hole passing through from the third surface to the fourth surface, and a third electrode provided in the through hole and coupled to the first electrode, and the second electrode is coupled to the third electrode and is electrically coupled to the first electrode via the third electrode.

An MEMS device according to a second aspect includes: a first substrate on which an MEMS element is disposed and a first electrode coupled to the MEMS element is provided on a first surface; a second substrate that has a second surface provided with a second electrode configured to be coupled to a control circuit; and a third substrate that has a third surface disposed between the first substrate and the second substrate and bonded to the first surface of the first substrate, and a fourth surface facing the second surface of the second substrate, in which the third substrate has a through hole passing through from the third surface to the fourth surface, and a third electrode provided in the through hole and coupled to the first electrode, and the second electrode is coupled to the third electrode and is electrically coupled to the first electrode via the third electrode.

DESCRIPTION OF EXEMPLARY EMBODIMENTS

First Embodiment

Hereinafter, an ultrasonic apparatus including an ultrasonic device according to the first embodiment will be described.

Figure 1:
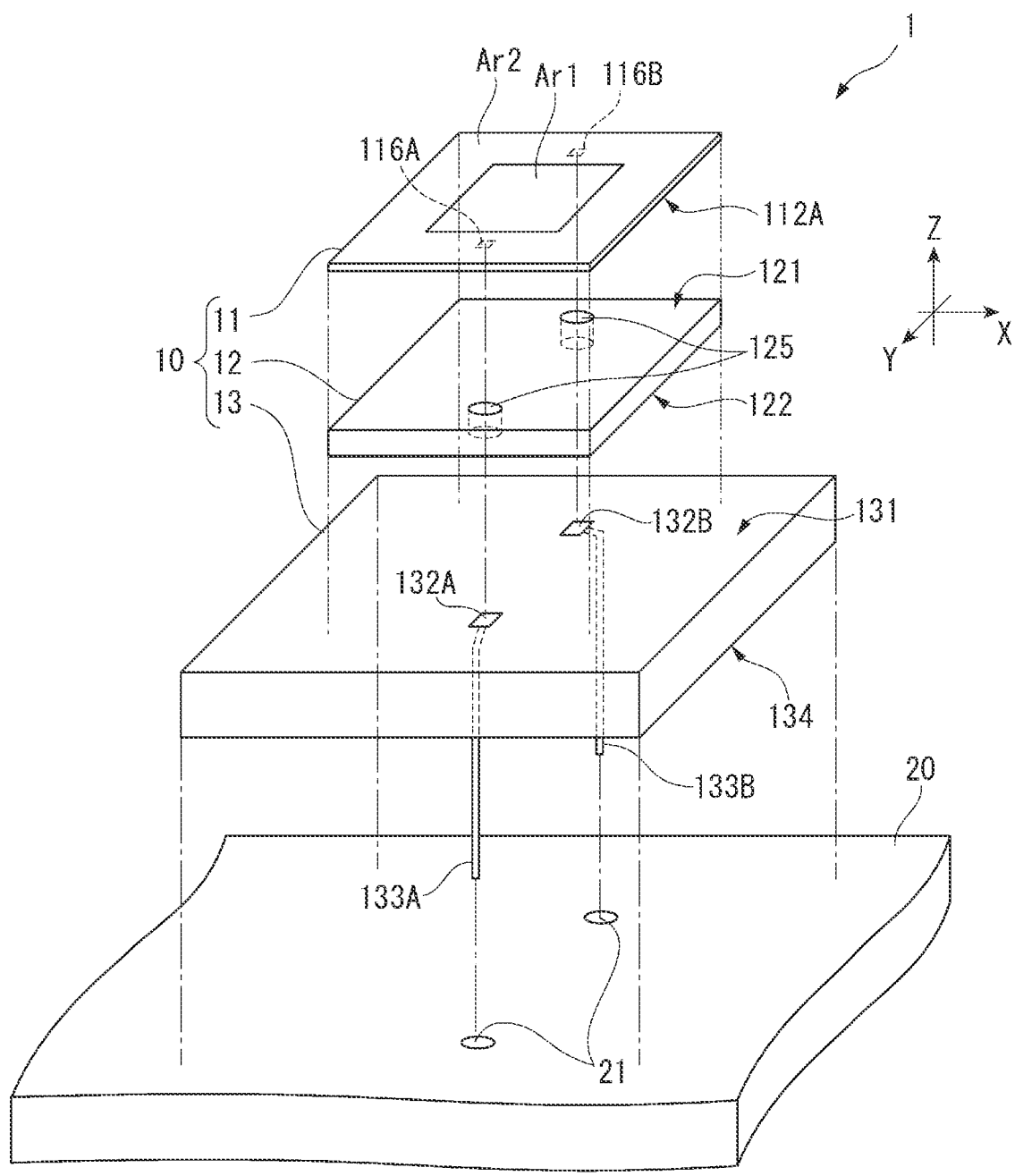
FIG. 1 is an exploded perspective view schematically showing a schematic configuration of an ultrasonic apparatus according to a first embodiment.

FIG. 1 is an exploded perspective view schematically showing a schematic configuration of an ultrasonic apparatus 1 according to the first embodiment.

As shown in FIG. 1, the ultrasonic apparatus 1 includes an ultrasonic device 10 and a control circuit 20 on which the ultrasonic device 10 is disposed.

The ultrasonic device 10 corresponds to the MEMS device and the piezoelectric device according to the present disclosure. As shown in FIG. 1, the ultrasonic device 10 includes an ultrasonic substrate 11, an intermediate substrate 12, and a second intermediate substrate 13, which are stacked in an order of the second intermediate substrate 13, the intermediate substrate 12, and the ultrasonic substrate 11. In the following description, a stacking direction of the second intermediate substrate 13, the intermediate substrate 12, and the ultrasonic substrate 11 is defined as a Z direction. One direction in a plane orthogonal to the Z direction is defined as an X direction, and a direction orthogonal to the X direction in the plane is defined as a Y direction.

Figure 2:
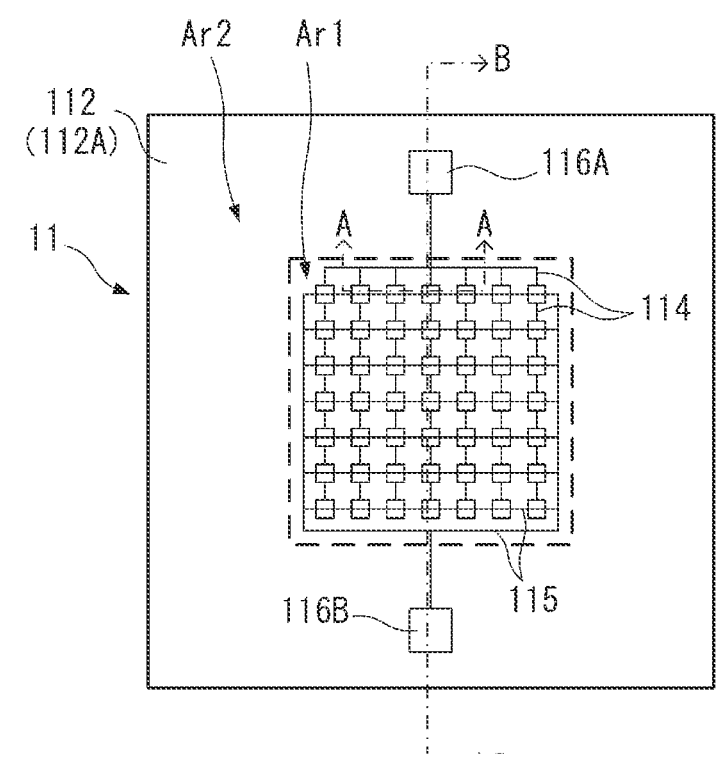
FIG. 2 is a plan view showing a schematic configuration of an ultrasonic substrate constituting the ultrasonic device according to the first embodiment.
Figure 3:
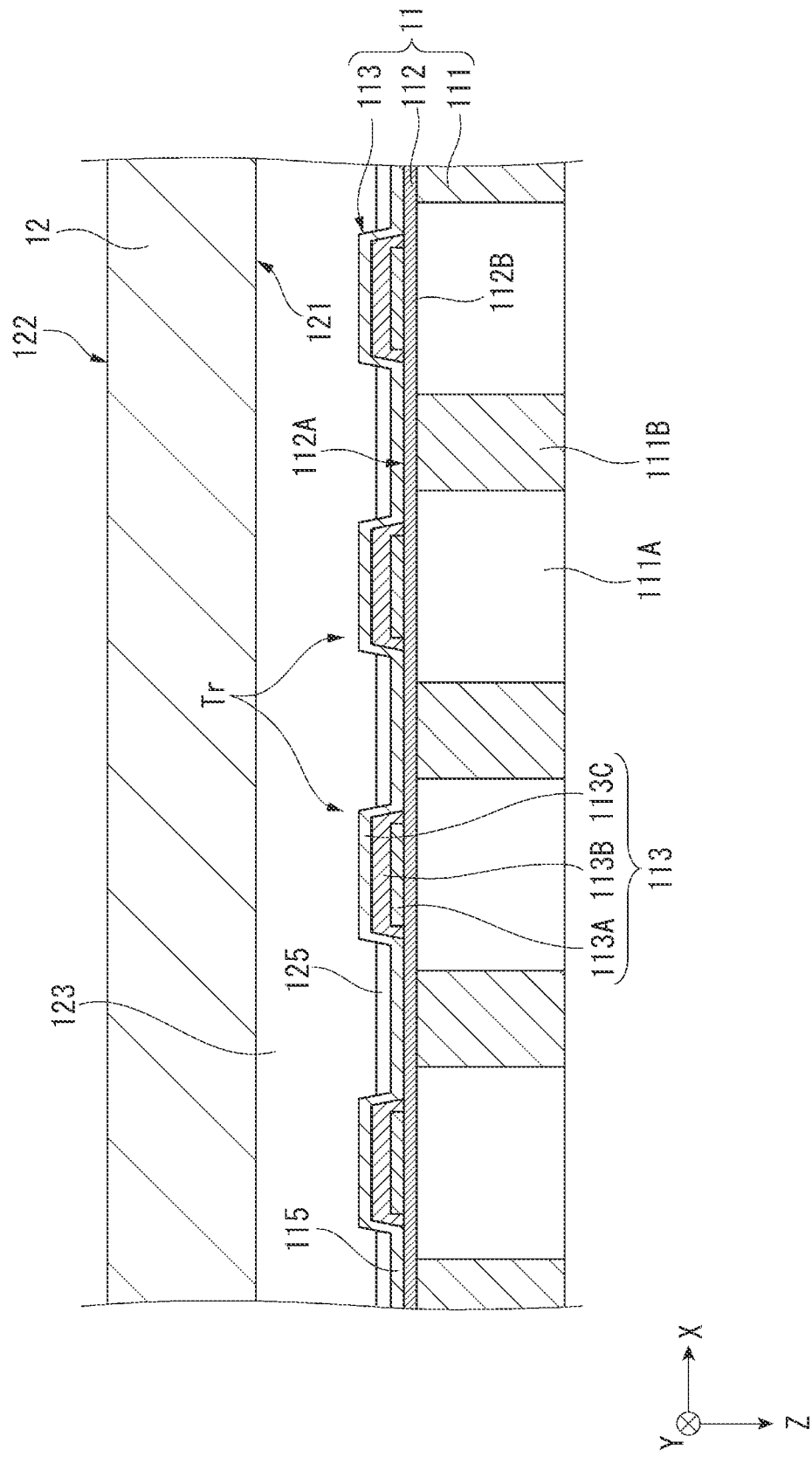
FIG. 3 is a cross-sectional view of the ultrasonic substrate and an intermediate substrate when the ultrasonic substrate and the intermediate substrate are cut along a line A-A in FIG. 2.
Figure 4:
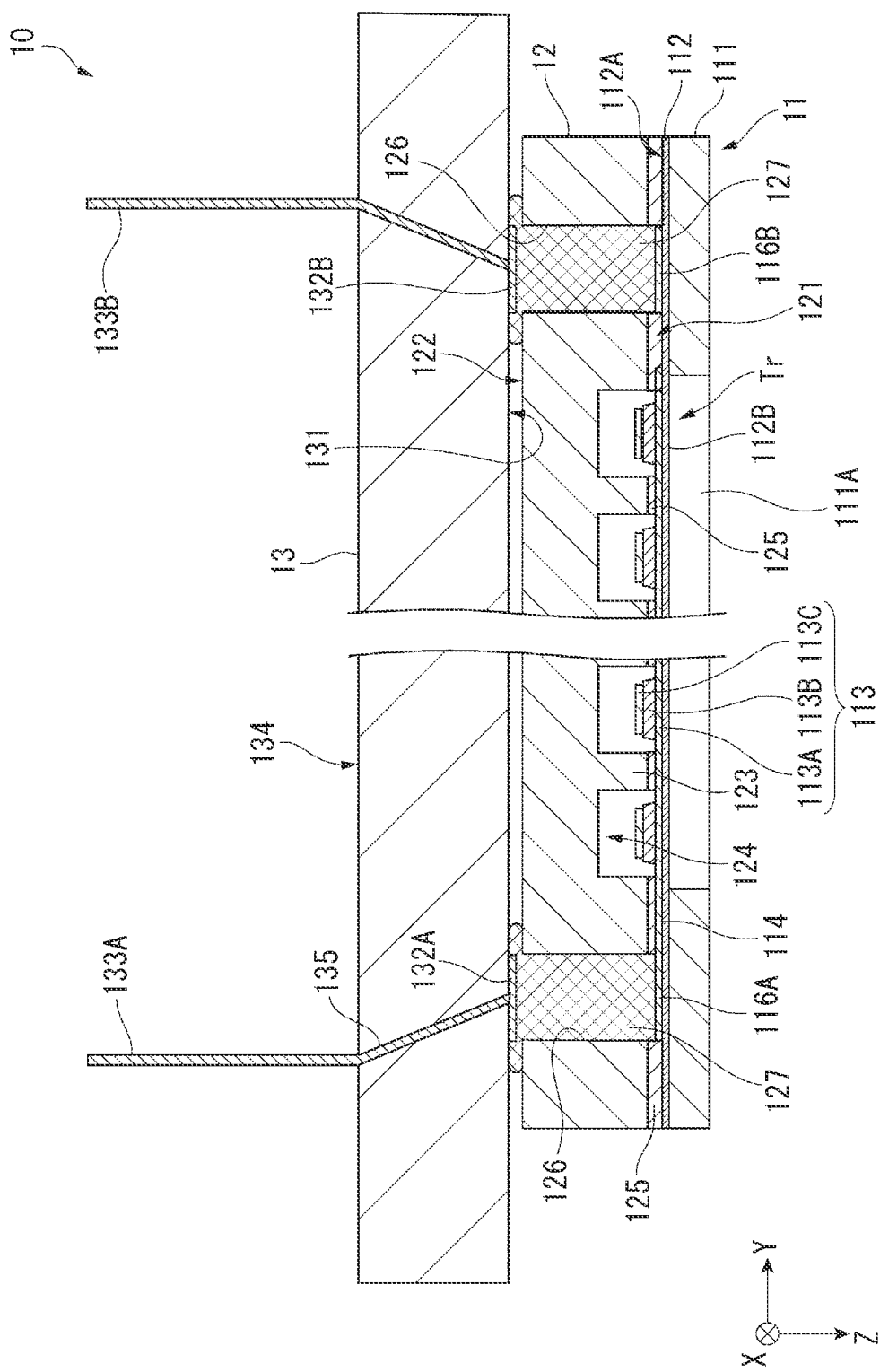
FIG. 4 is a cross-sectional view of the ultrasonic device when the ultrasonic device is cut along a line B-B in FIG. 2.

FIG. 2 is a plan view showing a schematic configuration of the ultrasonic substrate 11 constituting the ultrasonic device 10, and is a view of the ultrasonic substrate 11 viewed from an intermediate substrate 12 side. FIG. 3 is a cross-sectional view showing a schematic configuration when the ultrasonic substrate 11 and the intermediate substrate 12 are cut along the line A-A in FIG. 2. FIG. 4 is a cross-sectional view showing a schematic configuration when the ultrasonic device 10 is cut along the line B-B in FIG. 2.

The ultrasonic substrate 11 corresponds to the first substrate according to the present disclosure. As shown in FIGS. 3 and 4, the ultrasonic substrate 11 includes a substrate body 111, a vibration plate 112, and piezoelectric elements 113. As shown in FIGS. 1 and 2, a substrate central portion in the ultrasonic substrate 11 is a functional region Ar1. As shown in FIG. 2, an ultrasonic transducer Tr for transmitting and receiving ultrasonic waves is disposed in the functional region Ar1. An outer side of the functional region Ar1 is an outer peripheral region Ar2, and is bonded with the intermediate substrate 12.

The substrate body 111 is a semiconductor substrate containing, for example, Si. The functional region Ar1 of the substrate body 111 is provided with a plurality of openings 111A passing through in the Z direction, which is a transmission direction of the ultrasonic waves. In the present embodiment, as shown in FIGS. 2 and 3, the openings 111A are formed longitudinally in the Y direction. A plurality of the openings 111A are disposed along the X direction. Substrate wall portions 111B that define a width in the Y direction of each opening 111A are provided between adjacent openings 111A of the substrate body 111.

The vibration plate 112 is stacked on the substrate body 111 in a manner of blocking the openings 111A. A −Z side surface of the vibration plate 112, that is, the surface facing the intermediate substrate 12, is a first surface 112A according to the present disclosure.

In the present embodiment, as shown in FIGS. 3 and 4, the intermediate substrate 12 disposed in a manner of facing the ultrasonic substrate 11 includes a plurality of protruding portions 123 protruding toward the ultrasonic substrate 11. The plurality of protruding portions 123 are formed longitudinally in the X direction, and are disposed side by side along the Y direction. The tips of the protruding portions 123 are bonded to the vibration plate 112 with a bonding layer 125 interposed therebetween, which contains, for example, silicone resin. In such a configuration, a part of the vibration plate 112 that blocks the openings 111A is divided into a plurality of regions by the protruding portions 123. Each of the divided regions constitutes a vibrating portion 112B that vibrates in a transmission and reception processing of ultrasonic waves. That is, in the present embodiment, each vibrating portion 112B is formed by being surrounded by opening edges along the Y direction of the openings 111A and edges of the protruding portions 123 along the X direction.

Each piezoelectric element 113 is provided on each vibrating portion 112B on the first surface 112A of the vibration plate 112. Each piezoelectric element 113 includes a stack body of a lower electrode 113A, a piezoelectric film 113B, and an upper electrode 113C.

In the ultrasonic device 10 of the present embodiment, one ultrasonic transducer Tr includes one vibrating portion 112B and a piezoelectric element 113 disposed on the vibrating portion 112B. One of the lower electrode 113A and the upper electrode 113C of the ultrasonic transducer Tr is a drive electrode, and the other is a common electrode. The common electrode is maintained at a predetermined reference potential. For example, in the present embodiment, the lower electrode 113A is the drive electrode, and the upper electrode is the common electrode.

By inputting a drive pulse signal to the drive electrode of each ultrasonic transducers Tr, the piezoelectric element 113 is deformed, and the vibrating portion 112B vibrates. Accordingly, the ultrasonic transducer Tr transmits ultrasonic waves from the vibrating portion 112B to the +Z side.

When the ultrasonic waves are input from the openings 111A, the vibration portion 112B vibrates according to a sound pressure of the ultrasonic waves. The piezoelectric film 113B is deformed due to the vibration of the vibration portion 112B, and a potential difference is generated between the lower electrode 113A and the upper electrode 113C. Accordingly, a reception signal is output from the drive electrode of the ultrasonic transducer Tr according to the sound pressure of the received ultrasonic waves. That is, reception of the ultrasonic waves is detected.

In the ultrasonic substrate 11 of the present embodiment, as shown in FIG. 2, all lower electrodes 113A of the ultrasonic transducers Tr are coupled to each other by lower wiring electrodes 114. The lower wiring electrodes 114 extend to the outer peripheral region Ar2 on the first surface 112A of the vibration plate 112, and are coupled to a drive terminal 116A disposed in the outer peripheral region Ar2. All upper electrodes 113C of the ultrasonic transducers Tr are coupled to each other by upper wiring electrodes 115. The upper wiring electrodes 115 extends to the outer peripheral region Ar2 on the first surface 112A of the vibration plate 112, and are coupled to a common terminal 116B disposed in the outer peripheral region Ar2.

The drive terminal 116A and the common terminal 116B correspond to the first electrode according to the present disclosure.

In the present embodiment, although the drive terminal 116A and the common terminal 116B are disposed across the functional region Ar1 along the Y direction as shown in FIG. 1, the present disclosure is not limited thereto. The drive terminal 116A and the common terminal 116B may be disposed across the functional region Ar1 along the X direction. The drive terminal 116A and the common terminal 116B may not be disposed across the functional region Ar1, and for example, the drive terminal 116A may be provided on a +X side of the functional region Ar1, and the common terminal 116B may be provided on a +Y side of the functional region Ar1. Alternatively, the drive terminal 116A and the common terminal 116B may be disposed on one side of the functional region Ar1. For example, both the drive terminal 116A and the common terminal 116B may be provided on the +X side of the functional region Ar1.

The intermediate substrate 12 corresponds to the third substrate according to the present disclosure and is bonded to the vibration plate 112 of the ultrasonic substrate 11. A surface of the intermediate substrate 12 facing the ultrasonic device 10, that is, a +Z side surface, is a third surface 121 according to the present disclosure. A surface of the intermediate substrate 12 on a side opposite to the third surface 121, that is, a surface on the −Z side, which faces the second intermediate substrate 13, is a fourth surface 122 according to the present disclosure.

In the third surface 121 of the intermediate substrate 12 and at a position facing the functional region Ar1 of the ultrasonic device 10, as described above, the plurality of protruding portions 123 formed longitudinally in the X direction are provided along the Y direction. Accordingly, concave portions 124 are formed between the protruding portions 123 adjacent to each other in the Y direction.

Then, as described above, the vibration plate 112 is divided into the plurality of vibration portions 112B by the opening edge of the openings 111A along the Y direction and the edge of the protruding portions 123. That is, when viewed from the Z direction, a part of the vibration plate 112 where the openings 111A and the concave portions 124 overlap each other constitutes the vibrating portions 112B.

The intermediate substrate 12 have through holes 126 passing through from the third surface 121 to the fourth surface 122 respectively at positions facing the drive terminal 116A and the common terminal 116B of the ultrasonic substrate 11. A part of the third surface 121 of the intermediate substrate 12 facing the outer peripheral region Ar2 and not provided with the through holes 126 is bonded to the vibration plate 112 of the ultrasonic device 10, for example, by the bonding layer 125 which contains, for example, silicone resin.

Further, each through hole 126 of the intermediate substrate 12 is filled with a through electrode 127 corresponding to the third electrode according to the present disclosure. The through electrode 127 is made of a conductive bonding agent. Specifically, the through electrode 127 is a resin-based bonding agent containing a metal filler, and an epoxy resin, urethane resin, or silicone resin-based bonding agent, for example, can be used as the resin-based bonding agent. Accordingly, the through electrode 127 filled in the through hole 126 facing the drive terminal 116A is electrically coupled to the drive terminal 116A. The through electrode 127 filled in the through hole 126 facing the common terminal 116B is electrically coupled to the common terminal 116B.

The second intermediate substrate 13 corresponds to the second substrate of the present disclosure, and is fixed with the ultrasonic device 10 to which the intermediate substrate 12 is bonded. The second intermediate substrate 13 may be a rigid holder such as epoxy glass or ceramic, or may be a flexible substrate such as a flexible printed circuit (FPC) or a film substrate.

Specifically, the second intermediate substrate 13 includes a second surface 131 of the disclosure that faces the fourth surface 122 of the intermediate substrate 12.

A drive coupling terminal 132A facing the drive terminal 116A of the ultrasonic device 10 and a common coupling terminal 132B facing the common terminal 116B of the ultrasonic device 10 are provided on the second surface 131 of the second intermediate substrate 13 via the through holes 126 of the intermediate substrate 12, respectively. The drive coupling terminal 132A and the common coupling terminal 132B correspond to the second electrode according to the present disclosure.

In the present embodiment, the intermediate substrate 12 and the second intermediate substrate 13 are bonded by the through electrodes 127 filled in the through holes 126 of the intermediate substrate 12.

That is, the through electrode 127 electrically coupled to the drive terminal 116A extends in a predetermined range around the drive coupling terminal 132A on the second surface 131 of the second intermediate substrate 13. Accordingly, the through electrode 127 bonds the intermediate substrate 12 and the second intermediate substrate 13, and electrically couples the drive terminal 116A and the drive coupling terminal 132A. Similarly, the through electrode 127 electrically coupled to the common terminal 116B extends in a predetermined range around the common coupling terminal 132B on the second surface 131 of the second intermediate substrate 13. Accordingly, the through electrode 127 bonds the intermediate substrate 12 and the second intermediate substrate 13, and electrically couples the common terminal 116B and the common coupling terminal 132B.

In the present embodiment, the second intermediate substrate 13 includes a drive pin 133A electrically coupled to the drive coupling terminal 132A and a common pin 133B electrically coupled to the common coupling terminal 132B. For example, in the present embodiment, the drive pin 133A and the common pin 133B are provided on an installation surface 134 on a side opposite to the second surface 131 of the second intermediate substrate 13, and are coupled to the drive coupling terminal 132A and the common coupling terminal 132B via a coupling hole 135 passing through the second intermediate substrate 13.

Then, as shown in FIG. 1, the drive pin 133A and the common pin 133B are inserted into the through holes 21 provided in the control circuit 20, and the drive pin 133A and the common pin 133B are fixed to the control circuit 20 by soldering or the like, for example. Accordingly, the ultrasonic device 10 is fixed to the control circuit 20. Since the drive pin 133A and the common pin 133B are coupled to a predetermined print wiring of the control circuit 20, the control circuit 20 can control each ultrasonic transducer Tr of the ultrasonic device 10 and perform the transmission and reception processing of the ultrasonic waves.

Manufacturing Method of Ultrasonic Device 10

Next, a manufacturing method of the ultrasonic device 10 will be described.

Figure 5:
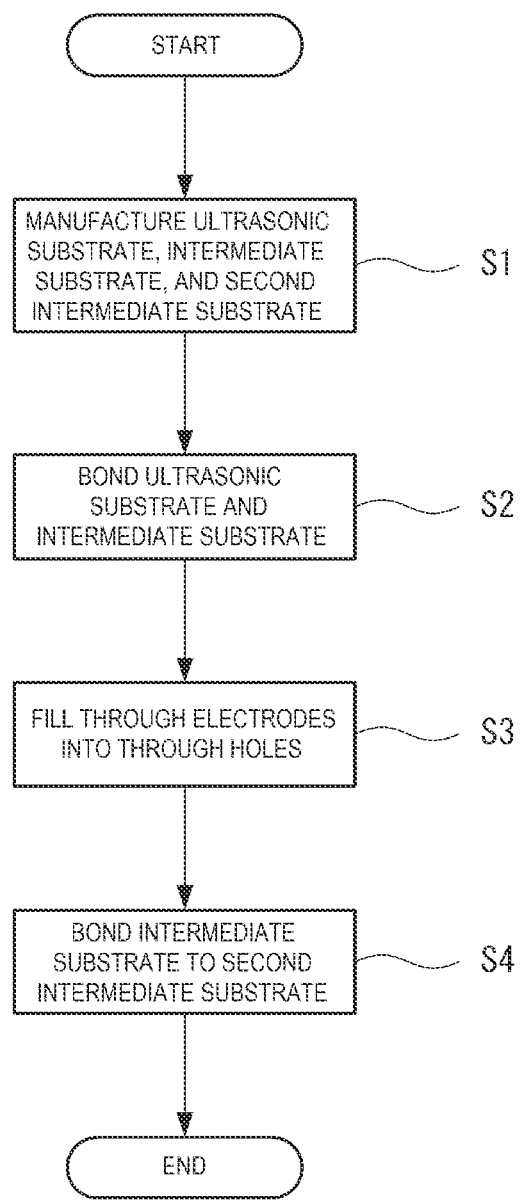
FIG. 5 is a flowchart showing a manufacturing method of the ultrasonic device according to the present embodiment.
Figure 6:
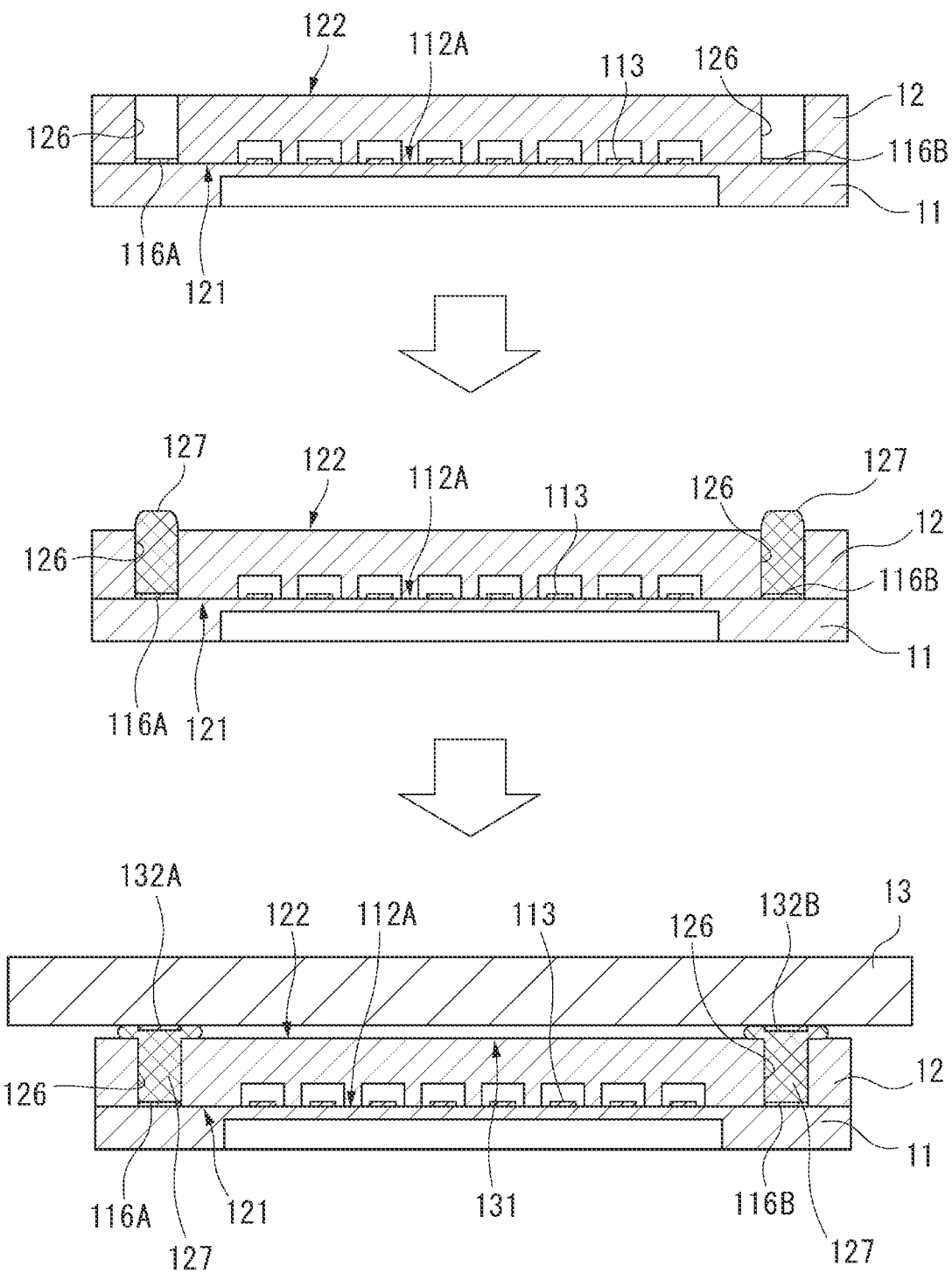
FIG. 6 is a schematic view showing a manufacturing process of the ultrasonic device according to the present embodiment.

FIG. 5 is a flowchart showing a manufacturing method of the ultrasonic device 10. FIG. 6 is a schematic view showing a manufacturing process of the ultrasonic device 10.

When the ultrasonic device 10 of the present embodiment is to be manufactured, first, the ultrasonic substrate 11, the intermediate substrate 12, and the second intermediate substrate 13 are manufactured individually (step S1). At the stage of step S1, the through electrodes 127 are not provided.

Next, as shown in the first step of FIG. 6, the ultrasonic substrate 11 and the intermediate substrate 12 are bonded (step S2).

The bonding of the intermediate substrate 12 to the ultrasonic substrate 11 is formed by a bonding member which contains, for example, silicone resin, in the outer peripheral region Ar2 of the first surface 112A of the ultrasonic substrate 11 and a region where the drive terminal 116A and the common terminal 116B are not provided. Then, alignment between the ultrasonic substrate 11 and the intermediate substrate 12 is adjusted in a manner that the pair of through holes 126 of the intermediate substrate 12 face the drive terminal 116A and the common terminal 116B, and the intermediate substrate 12 and the ultrasonic substrate 11 are bonded. By bonding the ultrasonic substrate 11 and the intermediate substrate 12, damage such as cracks in the ultrasonic substrate 11 during manufacturing can be prevented. At the stage of step S2, the through electrodes 127 are not provided.

Next, as shown in the second step of FIG. 6, the through electrodes 127 formed of the resin-based bonding agent containing the metal filler are filled into the through holes 126 of the intermediate substrate 12 (step S3). That is, the through holes 126 are filled with liquid or jelly-like through electrodes 127. At the time, the ultrasonic substrate 11 and the intermediate substrate 12 are held in a manner that the ultrasonic substrate 11 is disposed vertically below, and the fourth surface 122 of the intermediate substrate 12 is an upper surface, and the through electrodes 127 are filled in the through holes 126 in a manner that the through electrodes 127 protrude from the fourth surface 122 due to surface tension.

Thereafter, as shown in the third step of FIG. 6, the intermediate substrate 12 is bonded to the second intermediate substrate 13, whereby the ultrasonic device 10 is manufactured (step S4).

In step S4, the positions of the ultrasonic substrate 11 and the intermediate substrate 12 relating to the second intermediate substrate 13 are adjusted such that the drive coupling terminal 132A and the common coupling terminal 132B of the second intermediate substrate 13 are in contact with the surfaces of the through electrodes 127 protruding due to surface tension. Then, a pressure is applied along the Z direction. Accordingly, between the second intermediate substrate 13 and the intermediate substrate 12, the liquid or jelly-like through electrodes 127 wet-spread in a predetermined range around the drive coupling terminal 132A and in a predetermined range around the common coupling terminal 132B. Thereafter, the through electrodes 127 are solidified. Accordingly, the drive terminal 116A and the drive coupling terminal 132A are electrically coupled by the through electrodes 127 filled in the through holes 126 facing the drive terminal 116A. The common terminal 116B and the common coupling terminal 132B are electrically coupled by the through electrodes 127 filled in the through holes 126 facing the common terminal 116B. Further, the intermediate substrate 12 and the second intermediate substrate 13 are bonded by the through electrodes 127.

Effects of Present Embodiment

The ultrasonic device 10 of the present embodiment includes the ultrasonic substrate 11, the intermediate substrate 12, and the second intermediate substrate 13. The ultrasonic substrate 11 includes the piezoelectric elements 113 and the first surface 112A on which the drive terminal 116A and the common terminal 116B coupled to the piezoelectric elements 113 are disposed. The second intermediate substrate 13 includes the second surface 131 on which the drive coupling terminal 132A coupled to the control circuit 20 and the common coupling terminal 132B coupled to the control circuit 20 are disposed. The intermediate substrate 12 is disposed between the ultrasonic substrate 11 and the second intermediate substrate 13, and includes the third surface 121 bonded to the first surface 112A and the fourth surface 122 facing the second surface 131. The intermediate substrate 12 has the through holes 126 passing through from the third surface 121 to the fourth surface 122. The through hole 126 facing the drive terminal 116A is provided with the through electrode 127 coupled to the drive terminal 116A. The through hole 126 facing the common terminal 116B is provided with the through electrode 127 coupled to the common terminal 116B. Then, the drive coupling terminal 132A provided on the second intermediate substrate 13 is coupled to the through electrode 127, and is electrically coupled to the drive terminal 116A via the through electrode 127. The common coupling terminal 132B provided on the second intermediate substrate 13 is coupled to the through electrode 127, and is electrically coupled to the common terminal 116B via the through electrode 127.

In such a configuration, the drive terminal 116A and the common terminal 116B of the ultrasonic substrate 11 and the drive coupling terminal 132A and the common coupling terminal 132B of the second intermediate substrate 13 are facing each other respectively via the through holes 126 of the intermediate substrate 12, and are coupled by the through electrodes 127.

Therefore, it is not necessary to separately provide a bump electrode or the like, and the through electrode 127 and the drive coupling terminal 132A, and the through electrode 127 and the common coupling terminal 132B can be coupled to each other by a simple configuration. Accordingly, the size of the ultrasonic device 10 can be reduced as compared with a case where, for example, the bump electrode or the like is separately provided.

In the present embodiment, the through electrode 127 coupled to the drive terminal 116A is bonded to the drive coupling terminal 132A, and the through electrode 127 coupled to the common terminal 116B is bonded to the common coupling terminal 132B.

In such a configuration, the through electrodes 127 can couple the second intermediate substrate 13 and the intermediate substrate 12. Therefore, it is not necessary to provide a bonding layer for bonding the intermediate substrate 12 and the second intermediate substrate 13, and the configuration can be simplified.

In the present embodiment, the through electrodes 127 are made of the resin-based bonding agent containing the metal filler.

Accordingly, a bonding strength between the intermediate substrate 12 and the second intermediate substrate 13 can be sufficiently ensured.

Second Embodiment

Next, a second embodiment will be described.

In the first embodiment, the intermediate substrate 12 and the second intermediate substrate 13 are coupled to each other via the through electrodes 127. On the other hand, in the second embodiment, the intermediate substrate 12 and the second intermediate substrate 13 are further bonded by using another bonding agent, which is different from the first embodiment. In the following description, a description of already described items will be omitted or simplified.

Figure 7:
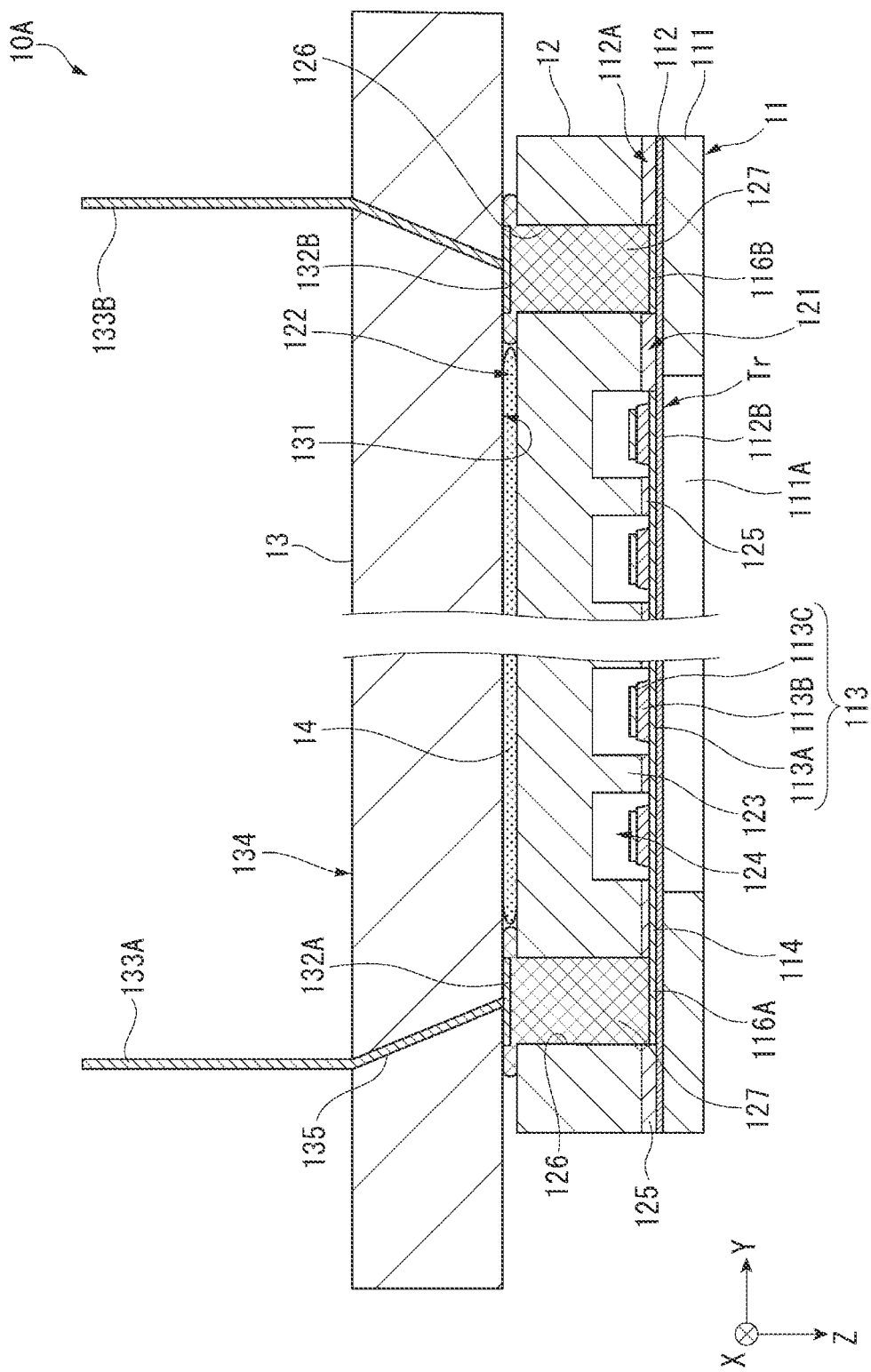
FIG. 7 is a cross-sectional view showing a schematic configuration of an ultrasonic device according to a second embodiment.

FIG. 7 is a cross-sectional view showing a schematic configuration of an ultrasonic device 10A according to the second embodiment.

As shown in FIG. 7, in the present embodiment, in the outer peripheral region Ar2 of the ultrasonic device 10A, the intermediate substrate 12 and the second intermediate substrate 13 are bonded by the through electrodes 127, which is similar as in the first embodiment.

Further, in the present embodiment, in the functional region Ar1, the intermediate substrate 12 and the second intermediate substrate 13 are bonded by a non-conductive paste (NCP) 14 which is an insulating resin-based bonding agent.

In such a configuration, when the ultrasonic device 10 is pressurized in the Z direction in step S4, the drive terminal 116A and the common terminal 116B are not electrically coupled when the through electrodes 127 and the NCP 14 are in contact with each other.

Effects of Present Embodiment

In the ultrasonic device 10A of the present embodiment, the NCP 14, which is an insulating resin-based bonding agent for bonding the intermediate substrate 12 and the second intermediate substrate 13, is provided between the intermediate substrate 12 and the second intermediate substrate 13.

Accordingly, the second intermediate substrate 13 and the intermediate substrate 12 can be more firmly bonded by using the NCP 14 in addition to the through electrode 127, and a problem that the intermediate substrate 12 falling off from the second intermediate substrate 13 can be prevented.

Third Embodiment

Next, a third embodiment will be described.

The first embodiment and the second embodiment show examples in which the second intermediate substrate 13 has a substrate shape.

On the other hand, the third embodiment is different from the first embodiment and the second embodiment in that the second intermediate substrate has an opening for transmitting the ultrasonic waves.

Figure 8:
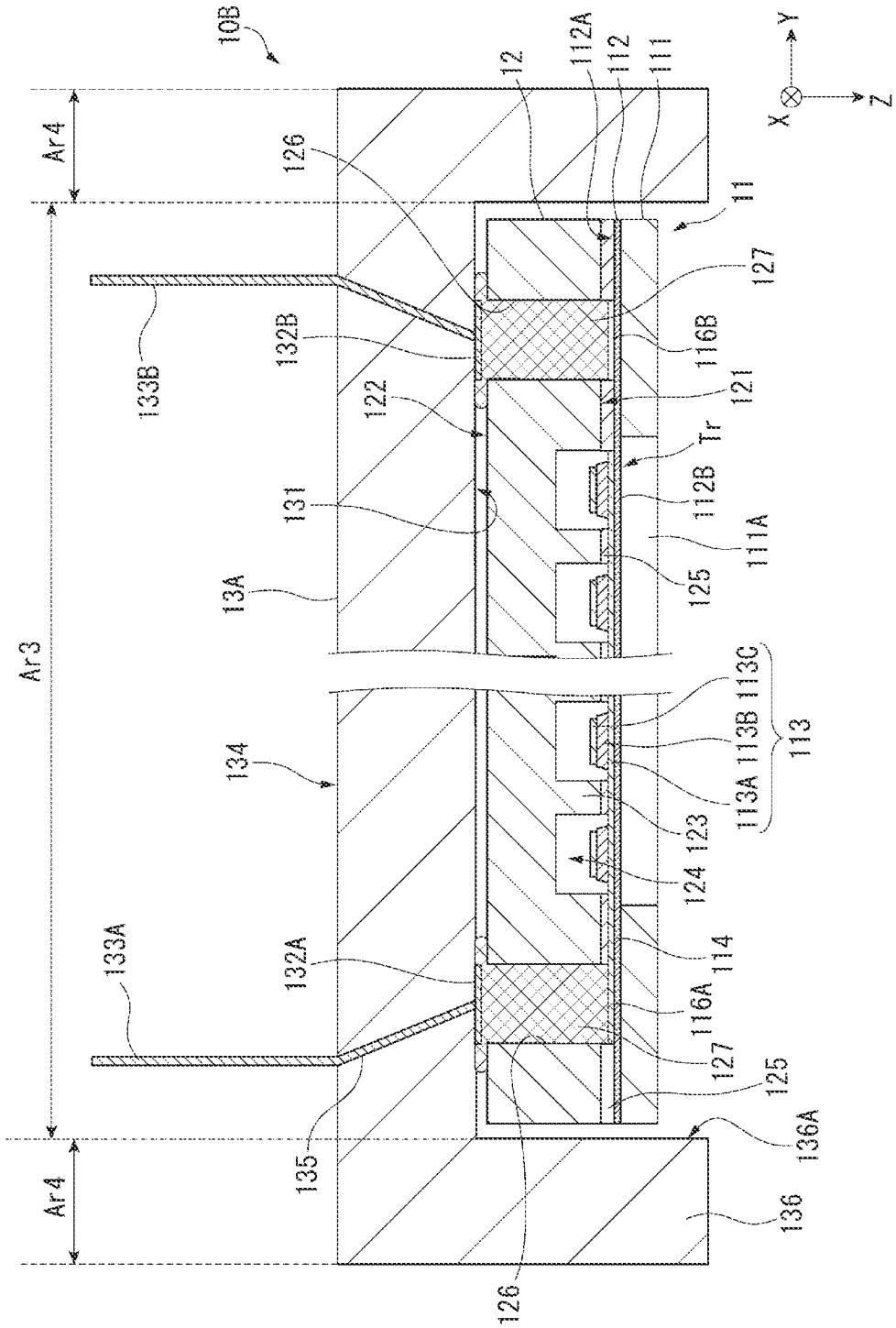
FIG. 8 is a cross-sectional view showing a schematic configuration of an ultrasonic device according to a third embodiment.

FIG. 8 is a cross-sectional view showing a schematic configuration of an ultrasonic device 10B according to the third embodiment.

As shown in FIG. 8, the second intermediate substrate 13A of the present embodiment is formed in a bottomed tubular shape. That is, the second intermediate substrate 13A includes a first region Ar3 in which the ultrasonic substrate 11 and the intermediate substrate 12 are stacked, and a second region Ar4 surrounding the outside of the first region Ar3, and the second region Ar4 includes a tubular portion 136 protruding in the Z direction. The tubular portion 136 may be a member fixed to the substrate shaped second intermediate substrate 13 according to the first embodiment or the second embodiment, or may be formed integrally with the substrate shaped second intermediate substrate 13 according to the first embodiment or the second embodiment. When the tubular portion 136 is formed as a separate body, the tubular portion 136 may contain a conductive material. In this case, the intrusion of electromagnetic waves into the tube of the tubular portion 136 can be prevented, and the influence of electromagnetic waves to the ultrasonic substrate 11 disposed inside the tube can be reduced.

The tips of the tubular portion 136 forms an opening 136A through which ultrasonic waves pass. The opening 136A may be provided with, for example, a mesh shaped protective member that prevents foreign matter from entering into the tubular portion 136.

Effects of Present Embodiment

In the ultrasonic device 10B of the present embodiment, the second intermediate substrate 13A includes the first region Ar3 in which the intermediate substrate 12 and the ultrasonic substrate 11 are stacked, and the second region Ar4 that surrounds the first region Ar3 on an outer side of the first region Ar3. Further, the second intermediate substrate 13A has a tubular portion 136 protruding in the Z direction in the second region Ar4, and the ultrasonic substrate 11 and the intermediate substrate 12 are disposed in the tube of the tubular portion 136.

In such a configuration, the tubular portion 136 functions as an aperture, and the directivity of the ultrasonic waves transmitted and received by the ultrasonic device 10B can be set appropriately. For example, unnecessary reception of ultrasonic waves input from a direction inclined relating to the first surface 112A can be prevented.

The tubular portion 136 may be formed of a conductive member, and in this case, a problem that noise is included in a reception signal output from the ultrasonic substrate 11 due to the influence of electromagnetic waves from the outside or the like can be prevented.

Fourth Embodiment

In the first embodiment, the plurality of lower electrodes 113A of the ultrasonic transducers Tr are coupled to one drive terminal 116A, and the plurality of the upper electrodes 113C of ultrasonic transducers Tr are coupled to one common terminal 116B. On the other hand, the ultrasonic substrate may include a plurality of transmission and reception channels, and each transmission and reception channel may be independently driven.

Figure 9:
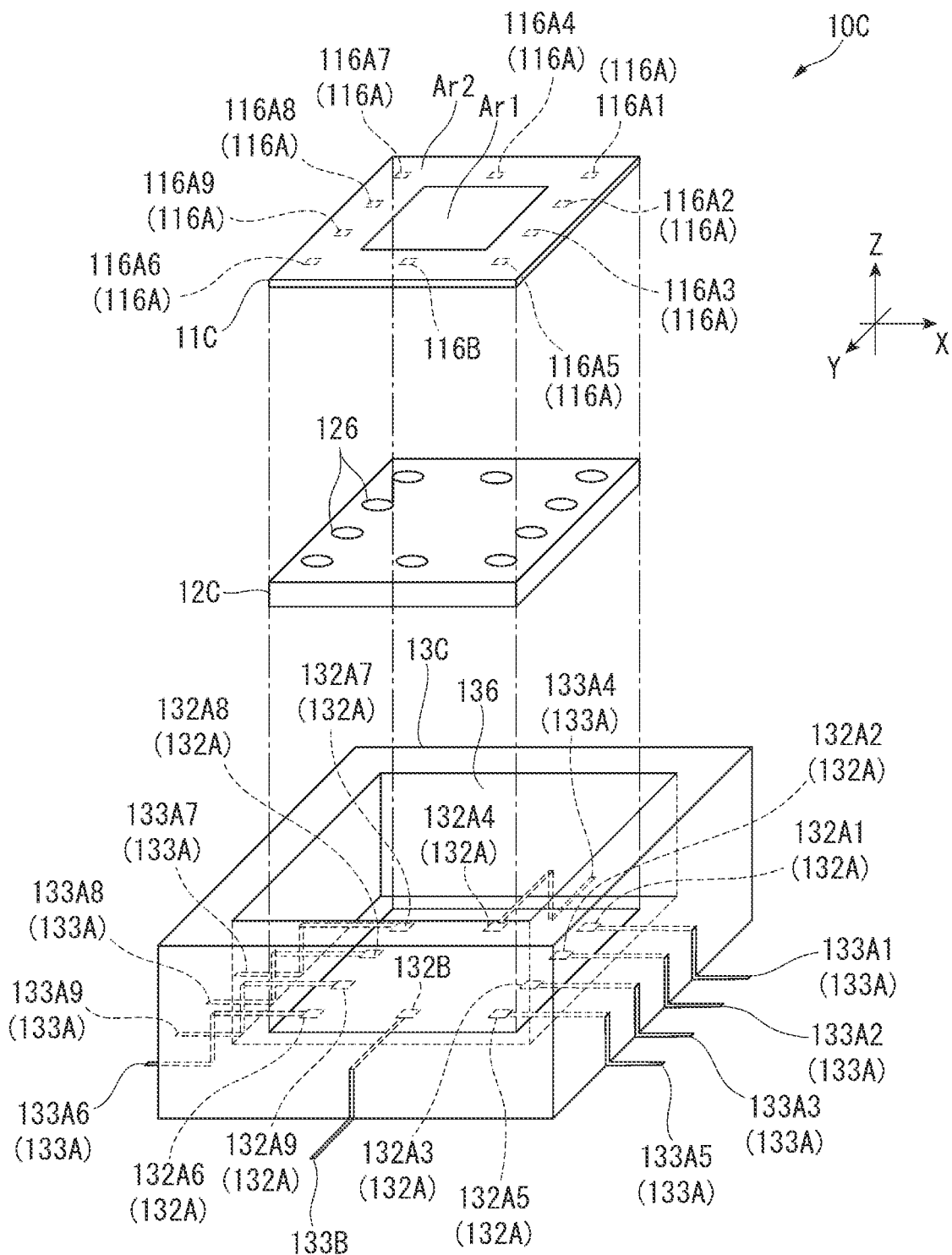
FIG. 9 is an exploded perspective view showing a schematic configuration of an ultrasonic device according to a fourth embodiment.
Figure 10:
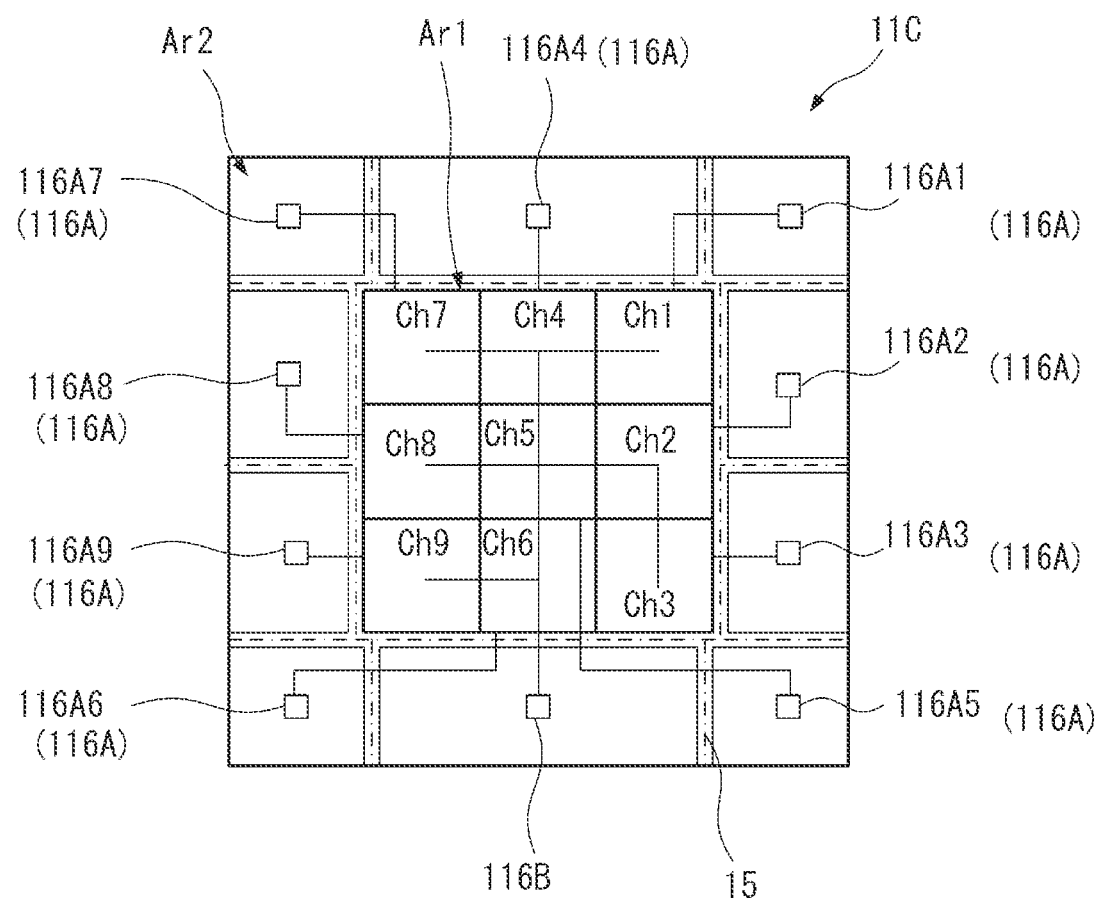
FIG. 10 is a schematic view showing a schematic configuration of an ultrasonic substrate according to the fourth embodiment.

FIG. 9 is an exploded perspective view showing a schematic configuration of an ultrasonic device 10C according to the fourth embodiment. FIG. 10 is a schematic view showing a schematic configuration of an ultrasonic substrate 11C of the fourth embodiment.

As shown in FIG. 10, the ultrasonic substrate 11C includes nine channels Ch1 to Ch9 in the functional region Ar1. Although not shown, each of the channels Ch1 to Ch9 includes an ultrasonic transducer Tr configured with a two-dimensional array structure along the X direction and the Y direction, similarly to the first embodiment.

In such an ultrasonic substrate 11, each of the channels Ch1 to Ch9 may function as a transmission and reception channel for transmitting and receiving ultrasonic waves. Alternatively, one of the channels may be used as an ultrasonic waves transmission channel, and remaining channels may function as ultrasonic reception channels. For example, the channel Ch5 disposed in the center of the functional region Ar1 may be driven as a reception channel alone, and other channels may be driven as transmission channels.

Although the present embodiment shows an example in which nine channels Ch1 to Ch9 are provided, the number of channels is not limited thereto, and eight or less, or ten or more channels may be provided.

The ultrasonic substrate 11C is provided with drive terminals 116A1 to 116A9 corresponding to the respective channels Ch1 to Ch9. In the present embodiment, as shown by dash-dotted lines in FIG. 10, the outer peripheral region Ar2 of the ultrasonic substrate 11C is divided into ten small regions corresponding to the drive terminals 116A1 to 116A9 of the respective channels Ch1 to Ch9 and the common terminal 116B.

For example, the plurality of lower electrodes 113A of the ultrasonic transducers Tr disposed in the first channel Ch1 are wired to each other and coupled to the first drive terminal 116A1. The plurality of lower electrodes 113A of the ultrasonic transducers Tr disposed in the second channel Ch2 are wired to each other and coupled to the second drive terminal 116A2. In this way, the channels Ch1 to Ch9 are coupled to the drive terminals 116A1 to 116A9 which are independent from each other, and are insulated from each other.

Since the same reference potential is applied to the upper electrodes 113C of the channels Ch1 to Ch9, one common terminal 116B may be provided alone as in the first embodiment and the second embodiment. Each common terminal 116B may be provided independently corresponding to the channels Ch1 to Ch9. In this case, small areas may be provided depending on the number of the drive terminals 116A and the number of the common terminals 116B.

In the present embodiment, the intermediate substrate 12C is provided with ten through holes 126 corresponding to the terminals (the drive terminals 116A1 to 116A9, and the common terminal 116B) provided in the respective small regions of the outer peripheral region Ar2.

Similarly, the second surface 131 of the second intermediate substrate 13C is provided with nine drive coupling terminals 132A (drive coupling terminals 132A1 to 132A9) and a common coupling terminal 132B corresponding to the drive terminals 116A1 to 116A9 and the common terminal 116B, respectively.

A partition wall portion 15 is provided between the intermediate substrate 12C and the second intermediate substrate 13C, between the adjacent drive coupling terminals 132A, and between the drive coupling terminals 132A and the common coupling terminal 132B.

The wall portion 15 is formed of a non-conductive member, and for example, an insulating bonding agent (for example, NCP) is used. In this case, in step S3 of FIG. 5, a non-conductive paste is applied to the intermediate substrate 12C or the second intermediate substrate 13C to form the wall portion 15, and further, each through hole 126 is filled with the through electrode 127. The order of the formation of the wall portion 15 and the filling of the through electrode 127 may be reversed. Then, in step S4, the second intermediate substrate 13C and the intermediate substrate 12C are superposed and pressurized. Accordingly, if the through electrodes 127 wet-spread between the second intermediate substrate 13C and the intermediate substrate 12C at the time of pressurization, contact of the through electrodes 127 between adjacent small regions can be prevented by the non-conductive wall portion 15.

Although nothing is provided in the functional region Ar1 between the second intermediate substrate 13C and the intermediate substrate 12C in the present embodiment, the NPC 14 may be provided in a similar manner as in the second embodiment.

In the present embodiment, the second intermediate substrate 13C includes a tubular portion 136 similarly as in the third embodiment. The drive coupling terminals 132A1 to 132A9 corresponding to the respective channels Ch1 to Ch9 are coupled to the drive pins 133A1 to 133A9 via the coupling hole 135 provided in the tubular portion 136. Similarly, the common coupling terminal 132B is coupled to the common pin 133B via a coupling hole 135 provided in the tubular portion 136.

Positions where the drive pin 133A and the common pin 133B are provided are not particularly limited, and, for example, as in the first embodiment, the drive pin 133A and the common pin 133B may be formed in a manner of protruding from the installation surface 134 of the second intermediate substrate 13C as in the first embodiment.

Effects of Present Embodiment

In the ultrasonic device 10C of the present embodiment, the ultrasonic substrate 11 includes the plurality of drive terminals 116A1 to 116A9 corresponding to the plurality of channels Ch1 to Ch9 and the common terminal 116B. The intermediate substrate 12C has the plurality of through holes 126 corresponding to the drive terminals 116A1 to 116A9 and the common terminal 116B. The second intermediate substrate 13C includes the plurality of drive coupling terminals 132A (drive coupling terminals 132A1 to 132A9) corresponding to the plurality of drive terminals 116A1 to 116A9, and the common coupling terminal 132B corresponding to the common terminal 116B. The through electrode 127 is filled in each through hole 126, and the through electrode 127 couples the drive coupling terminals 132A1 to 132A9 corresponding to the drive terminals 116A1 to 116A9, and couples the common coupling terminal 132B corresponding to the common terminal 116B. The wall portion 15 is provided between the second intermediate substrate 13C and the intermediate substrate 12C, between the adjacent drive coupling terminals 132A, and between the adjacent drive coupling terminals 132A and the common coupling terminal 132B.

Accordingly, if the through electrodes 127 wet-spread between the second intermediate substrate 13C and the intermediate substrate 12C, contact of the through electrodes 127 between the adjacent drive coupling terminals 132A and between the adjacent drive coupling terminals 132A and the common coupling terminal 132B can be prevented. Therefore, each of the channels Ch1 to Ch9 in the ultrasonic device 10C can be independently driven, and the transmission and reception processing of the ultrasonic waves using the plurality of channels Ch1 to Ch9 can be appropriately performed.

Modifications

The present disclosure is not limited to the above-described embodiments, and modifications, improvements, and the like within the scope of achieving the object of the present disclosure are included in the present disclosure.

Modification 1

In the above embodiments, a conductive paste is used as the through electrodes 127, and specifically, an example is shown, in which a resin-based bonding agent containing a metal filler is used.

On the other hand, for example, a rod-shaped metal member or the like may be used as the through electrodes 127. For example, in the first embodiment, the first electrode (the drive terminal 116A and the common terminal 116B) provided on the ultrasonic substrate 11 faces the second electrode (the drive coupling terminal 132A and the common coupling terminal 132B) of the second intermediate substrate 13 via the through hole 126 provided in the intermediate substrate 12. Therefore, if the third electrode, which is a rod-shaped metal member, is inserted into the through hole 126, and the ultrasonic substrate 11 and the second intermediate substrate 13 sandwich the third electrode, the first electrode and the second electrode can be electrically coupled via the third electrode.

In this case, for example, the intermediate substrate 12 and the second intermediate substrate 13 may be bonded by using an insulating bonding member such as the NCP 14 shown in the second embodiment.

The third electrode may be formed of a member that is melted by heating, such as soldering.

Modification 2

In the above embodiments, the resin-based bonding agent containing the metal filler is used as the through electrodes 127. On the other hand, the through electrodes 127 may be formed of anisotropic conductive paste (ACP).

In a case of using the ACP, a conductive path is formed in the Z direction by pressurizing in the Z direction, and non-conductivity is maintained in the X direction and the Y direction. Therefore, as in the fourth embodiment, when most of the through electrodes 127 are disposed in an XY plane, the wall portion 15 is unnecessary since non-conductivity is maintained even if adjacent through electrodes are in contact.

Modification 3

In the ultrasonic device 10C of the fourth embodiment, an example is shown in which the wall portion 15 provided between the intermediate substrate 12C and the second intermediate substrate 13C is formed by an insulating resin-based bonding agent. On the other hand, the material is not specifically limited as long as the wall potion 15 is a non-conductive member. For example, a frame member of a non-conductive solid body may be disposed between the intermediate substrate 12B and the second intermediate substrate 13C.

Modification 4

In the first embodiment, although an example is shown in which a plurality of vibrating portions 112B are formed by being surrounded by the openings 111A whose longitudinal direction is the Y direction and the protruding portions 123 whose longitudinal direction is the X direction, the present disclosure is not limited thereto. For example, the substrate body 111 is provided with openings disposed in a structure of a two-dimensional array along the X direction and the Y direction. In this case, each part with a blocked opening in the vibration plate 112 is each vibrating portion 112B. That is, an out shape and a size of each vibrating portion 112B may be defined only by the opening edges of the opening. In this case, in the intermediate substrate 12, an entire region facing the functional region Ar1 is formed in a concave manner, and in the functional region Ar1, the ultrasonic substrate 11 and the intermediate substrate 12 may not be bonded together.

Alternatively, the concave portions 124 formed by the protruding portions 123 of the intermediate substrate 12 may be disposed in a two-dimensional array structure along the X direction and the Y direction. In this case, parts of the vibration plate 112 that face the concave portions are the vibrating portions 112B. That is, the outer shape and the size of each vibrating portion 112B may be defined only by the edges of each protruding portion 123. In this case, the ultrasonic substrate 11 may be configured only with the vibration plate 112 and the piezoelectric element 113 without providing the substrate body 111.

Modification 5

In the above embodiments, although the ultrasonic device 10 is shown as an example of the piezoelectric device, the present disclosure is not limited thereto.

Figure 11:
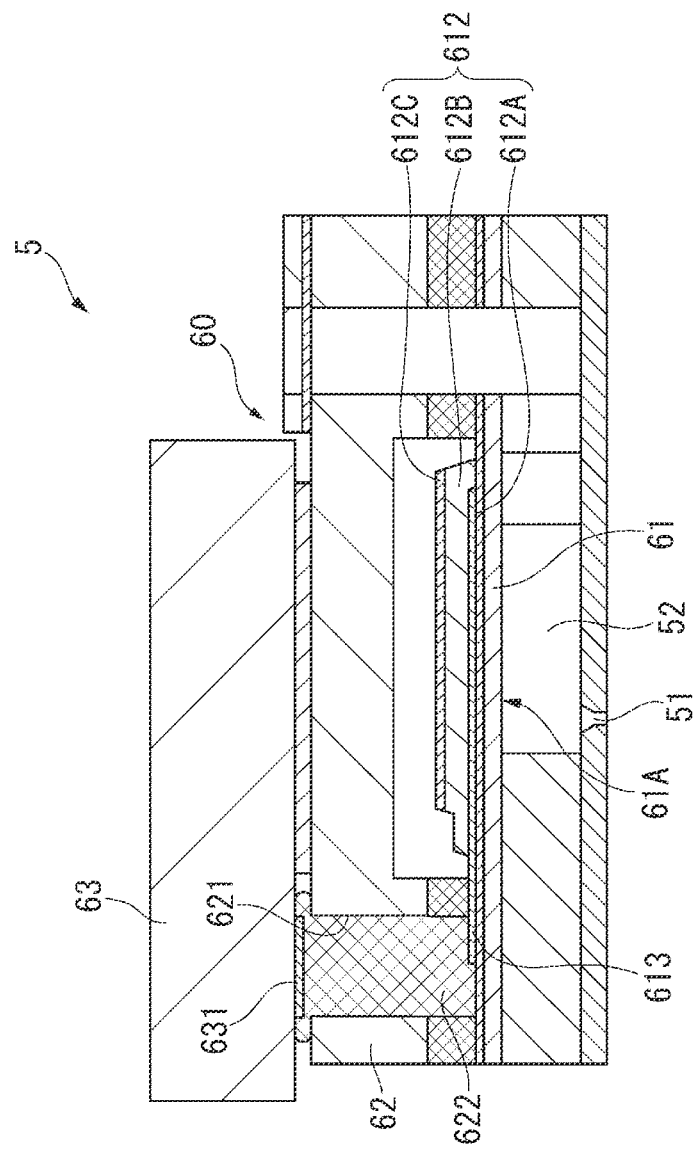
FIG. 11 is a cross-sectional view showing a schematic configuration of a print head according to Modification 5.

For example, the piezoelectric device may be a print head of an ink jet printer. FIG. 11 is a diagram showing an example of the print head.

In FIG. 11, the print head 5 has an ink tank 52 in which a nozzle 51 is provided, and a piezoelectric device 60 is provided on the ink tank 52. The piezoelectric device 60 includes a vibration plate 61 which is a first substrate, an intermediate substrate 62 which is a third substrate, and a circuit substrate 63 which is a second substrate.

The vibration plate 61 is provided in a manner of partially above the ink tank 52. A part of the vibration plate 61 above the ink tank 52 forms a vibrating portion 61A, and a piezoelectric element 612 is disposed on the vibrating portion 61A. The piezoelectric element 612 is formed of a stack body of a lower electrode 612A, a piezoelectric film 612B, and an upper electrode 612C similar as in the above embodiment. The vibration plate 61 is provided with a drive terminal 613 electrically coupled to the lower electrode 612A and a common terminal (not shown) electrically coupled to the upper electrode. The drive terminal 613 and the common terminal correspond to the first electrode according to the present disclosure.

The intermediate substrate 62 is a substrate bonded to the vibration plate 61, and is provided with a through hole 621 facing the drive terminal 613, as shown in FIG. 11. Although not shown, a through hole is also provided at a position facing the common terminal.

The circuit substrate 63 is a substrate disposed in a manner of facing the intermediate substrate 62, and includes a drive coupling terminal 631 facing the drive terminal 613 via the through hole 621, and a common coupling terminal (not shown) facing the common terminal via the through hole. The drive coupling terminal 631 and the common coupling terminal correspond to the second electrode according to the present disclosure.

Then, in the print head 5, similarly to the embodiment described above, the through hole 621 is filled with the through electrode 622 as the second electrode formed of a resin-based bonding agent containing a metal filler. Accordingly, the drive terminal 613 and the drive coupling terminal 631, and the common terminal and the common coupling terminal are coupled by the through electrode 622.

Since the through electrode 622 is bonded to the second electrode (drive coupling terminal 631 and common coupling terminal) of the circuit substrate 63, the intermediate substrate 62 and the circuit substrate 63 are bonded.

Although the print head 5 is shown as another example of the piezoelectric device including the piezoelectric element 612, the present disclosure can also be applied to an MEMS device other than the piezoelectric device.

For example, although the ultrasonic device 10 of the first embodiment includes a so-called pMUT type ultrasonic transducer Tr in which the piezoelectric element 113 is disposed on the vibrating portion 112B, the present disclosure is not limited thereto.

For example, a so-called cMUT type ultrasonic substrate may be used as the ultrasonic substrate as the first substrate. In this case, the ultrasonic substrate includes a vibration plate and a counter substrate facing the vibration plate, electrodes are respectively disposed on the substrates, and a periodic drive voltage is applied between the electrodes to vibrate the vibration plate. In this case, the first electrode coupled to the electrode is provided on the counter substrate or the vibration plate. In a case where the first electrode is coupled to the second electrode provided on the second intermediate substrate, the third electrode provided in the through hole of the intermediate substrate can be used in a similar manner as in the above embodiment.

The MEMS device is not limited to the piezoelectric device and the ultrasonic device described above. As another example of the MEMS device, for example, a mirror device having a plurality of micromirrors and having a first substrate that changes the angle of each micromirror by an actuator can be exemplified.

Overview of Disclosure

The piezoelectric device according to the first aspect includes: a first substrate that includes a first surface on which a piezoelectric element and a first electrode coupled to the piezoelectric element are disposed; a second substrate that includes a second surface on which a second electrode configured to be coupled to a control circuit is disposed; and a third substrate that is disposed between the first substrate and the second substrate, and includes a third surface bonded to the first surface and a fourth surface facing the second surface, in which the third substrate has a through hole passing through from the third surface to the fourth surface, and a third electrode provided in the through hole and coupled to the first electrode, and the second electrode is coupled to the third electrode and is electrically coupled to the first electrode via the third electrode.

In the piezoelectric device of this aspect, the first electrode of the first substrate and the second electrode of the second substrate faces each other via the through hole of the third substrate, and are coupled by the third electrode inserted into the through hole. Accordingly, for example, it is not necessary to separately provide a bump electrode or the like, and the coupling between the second electrode and the first electrode, and the coupling between the second electrode and the third electrode can be achieved by a simple configuration, and the size of the piezoelectric device can be reduced.

In the piezoelectric device according to the first aspect, it is preferable that the third electrode is bonded to the second electrode.

Accordingly, the second substrate and the third electrode can be bonded to each other by the second electrode, and a separate bonding layer for bonding the second substrate and the third substrate is not necessary.

In the piezoelectric device according to the first aspect, it is preferable that the third electrode is a resin-based bonding agent including a metal filler.

Accordingly, the first electrode and the second electrode using the third electrode can be electrically coupled while securing sufficient bonding strength between the second substrate and the third substrate.

In the piezoelectric device according to the first aspect, the first substrate is provided with a plurality of the first electrodes, the second substrate is provided with a plurality of the second electrodes corresponding to the plurality of first electrodes, the third substrate is provided with a plurality of the through holes and a plurality of the third electrodes corresponding to the plurality of first electrodes, and each one of the third electrodes is coupled to each one of the second electrodes, and a wall portion that partitions between adjacent ones of the second electrodes is provided between the second substrate and the third substrate.

In this aspect, since an insulating wall portion is provided between the second substrate and the third substrate and between the third electrodes disposed adjacently, contact between the third electrodes can be prevented. Therefore, independent signals can be input to the plurality of first electrodes of the piezoelectric device, respectively.

In the piezoelectric device according to the first aspect, it is preferable that the wall portion is formed of an insulating resin-based bonding agent.

Accordingly, the second substrate and the third substrate can be firmly bonded to each other by the resin-based bonding agent, and the bonding strength can be sufficiently ensured.

In the piezoelectric device according to the first aspect, an insulating resin-based bonding agent for bonding the second substrate and the third substrate is further provided between the second substrate and the third substrate.

Accordingly, the bonding strength between the second substrate and the third substrate can be further increased, and separation between the second substrate and the third substrate can be prevented.

In the piezoelectric device according to the first aspect, the second substrate includes a first region in which the third substrate and the first substrate are stacked, and a second region that surrounds the first region at an outer side of the first region, and a tubular portion that protrudes in a stacking direction in which the third substrate and the first substrate are stacked is provided in the second region of the second substrate, and the second substrate and the third substrate are disposed in a tube of the tubular portion.

Accordingly, when the tubular portion functions as an aperture and the piezoelectric device is used as an ultrasonic device, the directivity of the ultrasonic waves can be set appropriately.

When the tubular portion is made of a conductive member, the piezoelectric element of the first substrate can be prevented from a problem of being affected by electromagnetic waves from the outside, and the piezoelectric element can be appropriately driven.

The MEMS device according to the second aspect includes: a first substrate on which an MEMS element is disposed and a first electrode coupled to the MEMS element is provided on a first surface; a second substrate that has a second surface provided with a second electrode configured to be coupled to a control circuit; and a third substrate that has a third surface disposed between the first substrate and the second substrate and bonded to the first surface of the first substrate, and a fourth surface facing the second surface of the second substrate, in which the third substrate has a through hole passing through from the third surface to the fourth surface, and a third electrode provided in the through hole and coupled to the first electrode, and the second electrode is coupled to the third electrode and is electrically coupled to the first electrode via the third electrode.

In the MEMS device of this aspect, the first electrode of the first substrate and the second electrode of the second substrate face each other via the through hole of the third substrate, and are coupled by the third electrode inserted into the through hole. Accordingly, for example, it is not necessary to separately provide a bump electrode or the like, and the coupling between the second electrode and the first electrode, the coupling between the second electrode and the third electrode can be achieved with a simple configuration, and the size of the MEMS device can be reduced.

What is claimed is:

1. A piezoelectric device, comprising:
    a first substrate that includes a first surface on which a piezoelectric element and a first electrode coupled to the piezoelectric element are disposed, wherein the first substrate is provided with a plurality of the first electrodes;
    a second substrate that includes a second surface on which a second electrode configured to be coupled to a control circuit is disposed, wherein the second substrate is provided with a plurality of the second electrodes corresponding to the plurality of the first electrodes;
    a third substrate that is disposed between the first substrate and the second substrate, and includes a third surface bonded to the first surface and a fourth surface facing the second surface, wherein
        the third substrate has a through hole passing through from the third surface to the fourth surface, and a third electrode provided in the through hole and coupled to the first electrode,
        the third substrate is provided with a plurality of the through holes and a plurality of the third electrodes corresponding to the plurality of the first electrodes, and each one of the third electrodes is coupled to each one of the second electrodes, and the second electrode is coupled to the third electrode and is electrically coupled to the first electrode via the third electrode; and a wall portion that partitions between adjacent ones of the second electrodes is provided between the second substrate and the third substrate.

2. The piezoelectric device according to claim 1, wherein the third electrode is bonded to the second electrode.

3. The piezoelectric device according to claim 2, wherein the third electrode is a resin-based bonding agent including a metal filler.

4. The piezoelectric device according to claim 1, wherein the wall portion is formed of an insulating resin-based bonding agent.

5. The piezoelectric device according to claim 1, wherein an insulating resin-based bonding agent for bonding the second substrate and the third substrate is further provided between the second substrate and the third substrate.

6. The piezoelectric device according to claim 1, wherein the second substrate includes a first region in which the third substrate and the first substrate are stacked, and a second region that surrounds the first region at an outer side of the first region, and a tubular portion that protrudes in a stacking direction in which the third substrate and the first substrate are stacked is provided in the second region of the second substrate, and the second substrate and the third substrate are disposed in a tube of the tubular portion.

7. The piezoelectric device according to claim 2, wherein the second substrate includes a first region in which the third substrate and the first substrate are stacked, and a second region that surrounds the first region at an outer side of the first region, and a tubular portion that protrudes in a stacking direction in which the third substrate and the first substrate are stacked is provided in the second region of the second substrate, and the second substrate and the third substrate are disposed in a tube of the tubular portion.

8. The piezoelectric device according to claim 3, wherein the second substrate includes a first region in which the third substrate and the first substrate are stacked, and a second region that surrounds the first region at an outer side of the first region, and a tubular portion that protrudes in a stacking direction in which the third substrate and the first substrate are stacked is provided in the second region of the second substrate, and the second substrate and the third substrate are disposed in a tube of the tubular portion.

9. The piezoelectric device according to claim 1, wherein the second substrate includes a first region in which the third substrate and the first substrate are stacked, and a second region that surrounds the first region at an outer side of the first region, and a tubular portion that protrudes in a stacking direction in which the third substrate and the first substrate are stacked is provided in the second region of the second substrate, and the second substrate and the third substrate are disposed in a tube of the tubular portion.

10. The piezoelectric device according to claim 4, wherein the second substrate includes a first region in which the third substrate and the first substrate are stacked, and a second region that surrounds the first region at an outer side of the first region, and a tubular portion that protrudes in a stacking direction in which the third substrate and the first substrate are stacked is provided in the second region of the second substrate, and the second substrate and the third substrate are disposed in a tube of the tubular portion.

11. The piezoelectric device according to claim 5, wherein the second substrate includes a first region in which the third substrate and the first substrate are stacked, and a second region that surrounds the first region at an outer side of the first region, and a tubular portion that protrudes in a stacking direction in which the third substrate and the first substrate are stacked is provided in the second region of the second substrate, and the second substrate and the third substrate are disposed in a tube of the tubular portion.

12. An MEMS device, comprising:

a first substrate on which an MEMS element is disposed and a first electrode coupled to the MEMS element is provided on a first surface, wherein the first substrate is provided with a plurality of the first electrodes;

a second substrate that has a second surface provided with a second electrode configured to be coupled to a control circuit, wherein the second substrate is provided with a plurality of the second electrodes corresponding to the plurality of the first electrodes;

a third substrate that has a third surface disposed between the first substrate and the second substrate and bonded to the first surface of the first substrate, and a fourth surface facing the second surface of the second substrate, wherein the third substrate has a through hole passing through from the third surface to the fourth surface, and a third electrode provided in the through hole and coupled to the first electrode, the third substrate is provided with a plurality of the through holes and a plurality of the third electrodes corresponding to the plurality of the first electrodes, and each one of the third electrodes is coupled to each one of the second electrodes, and the second electrode is coupled to the third electrode and is electrically coupled to the first electrode via the third electrode; and a wall portion that partitions between adjacent ones of the second electrodes is provided between the second substrate and the third substrate.

13. A piezoelectric device, comprising:

a first substrate that includes a first surface on which a piezoelectric element and a first electrode coupled to the piezoelectric element are disposed;

a second substrate that includes a second surface on which a second electrode configured to be coupled to a control circuit is disposed;

a third substrate that is disposed between the first substrate and the second substrate, and includes a third surface bonded to the first surface and a fourth surface facing the second surface, wherein the second substrate includes a first region in which the third substrate and the first substrate are stacked, and a second region that surrounds the first region at an outer side of the first region, the third substrate has a through hole passing through from the third surface to the fourth surface, and a third electrode provided in the through hole and coupled to the first electrode, and the second electrode is coupled to the third electrode and is electrically coupled to the first electrode via the third electrode; and a tubular portion that protrudes in a stacking direction in which the third substrate and the first substrate are stacked is provided in the second region of the second substrate, and the second substrate and the third substrate are disposed in a tube of the tubular portion.

* * * * *